United States Patent
Heo et al.

(10) Patent No.: US 12,382,577 B2
(45) Date of Patent: Aug. 5, 2025

(54) FLEXIBLE PCB RF CABLE

(71) Applicant: AMOSENSE CO.,LTD, Cheonan-si (KR)

(72) Inventors: Jeonggeun Heo, Cheonan-si (KR); Seho Lee, Cheonan-si (KR); Jeongsang Yu, Cheonan-si (KR); Hyungil Baek, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 115 days.

(21) Appl. No.: 18/008,419

(22) PCT Filed: May 31, 2021

(86) PCT No.: PCT/KR2021/095068
§ 371 (c)(1),
(2) Date: Dec. 5, 2022

(87) PCT Pub. No.: WO2021/246850
PCT Pub. Date: Dec. 9, 2021

(65) Prior Publication Data
US 2023/0232529 A1 Jul. 20, 2023

(30) Foreign Application Priority Data
Jun. 5, 2020 (KR) .................. 10-2020-0068510

(51) Int. Cl.
*H05K 1/02* (2006.01)
*H05K 1/03* (2006.01)
*H05K 1/14* (2006.01)

(52) U.S. Cl.
CPC ......... *H05K 1/0242* (2013.01); *H05K 1/0224* (2013.01); *H05K 1/0225* (2013.01);
(Continued)

(58) Field of Classification Search
CPC .... H05K 1/0242; H05K 1/0224; H05K 1/028; H05K 1/147; H05K 2201/093;
(Continued)

(56) References Cited

U.S. PATENT DOCUMENTS 5,334,800 A * 8/1994 Kenney ................ H05K 1/0224
174/250
6,225,568 B1 * 5/2001 Lin ...................... H05K 1/0224
174/250
(Continued)

FOREIGN PATENT DOCUMENTS

JP 2000156549 A 6/2000
KR 10-2014-0117855 A 10/2014
(Continued)

OTHER PUBLICATIONS

KR Office Action dated Nov. 13, 2024 in application 1020200068510.

*Primary Examiner* — Ishwarbhai B Patel
(74) *Attorney, Agent, or Firm* — Maschoff Brennan

(57) ABSTRACT

Disclosed is a flexible PCB RF cable having a ground pattern that is divided into two ground patterns, which are connected through a connection pattern arranged in an area overlapped with a signal line pattern, and thus cracks are minimized during bending. The disclosed flexible PCB RF cable comprises: a signal line pattern interposed between a first dielectric sheet and a second dielectric sheet; first and second lower ground patterns, which are mesh patterns arranged to be spaced from each other below the first dielectric sheet; a lower connection pattern connected to the first and second lower ground patterns; first and second upper ground patterns, which are mesh patterns arranged to be spaced from each other above the second dielectric sheet; and an upper connection pattern connected to the first and second ground patterns.

9 Claims, 10 Drawing Sheets

(52) U.S. Cl.
CPC .............. H05K 1/028 (2013.01); H05K 1/147 (2013.01); *H05K 1/0253* (2013.01); *H05K 1/0393* (2013.01); *H05K 2201/093* (2013.01)

(58) Field of Classification Search
CPC .. H05K 1/0225; H05K 1/0253; H05K 1/0393; H01B 7/04; H01B 7/18; H01B 11/18; H01B 11/1878
See application file for complete search history.

(56) References Cited

U.S. PATENT DOCUMENTS

| | | |
|---|---|---|
| 10,356,895 B2 | 7/2019 | Kim et al. |
| 2010/0314159 A1* | 12/2010 | Lee ...................... H05K 1/0253 |
| | | 174/254 |
| 2011/0030995 A1* | 2/2011 | Lee ....................... H05K 1/024 |
| | | 174/250 |
| 2012/0183760 A1 | 7/2012 | Kodama et al. |
| 2016/0020500 A1* | 1/2016 | Matsuda ................. H05K 3/42 |
| | | 333/238 |

FOREIGN PATENT DOCUMENTS

| | | |
|---|---|---|
| KR | 10-2018-0080611 A | 7/2018 |
| KR | 10-2040790 B1 | 11/2019 |
| WO | 2017/052048 A1 | 3/2017 |

\* cited by examiner

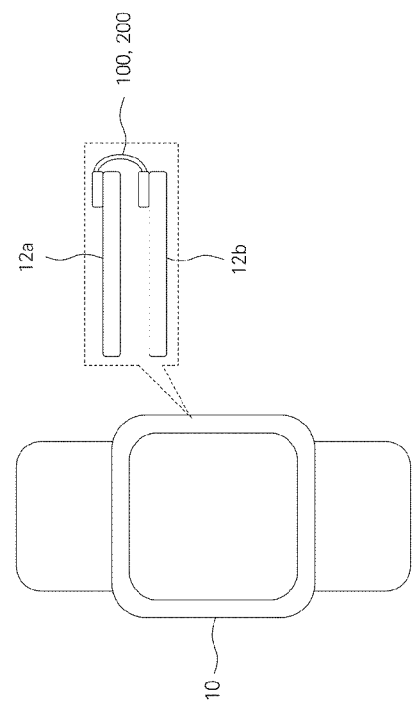
[Fig. 1]

[Fig. 2]
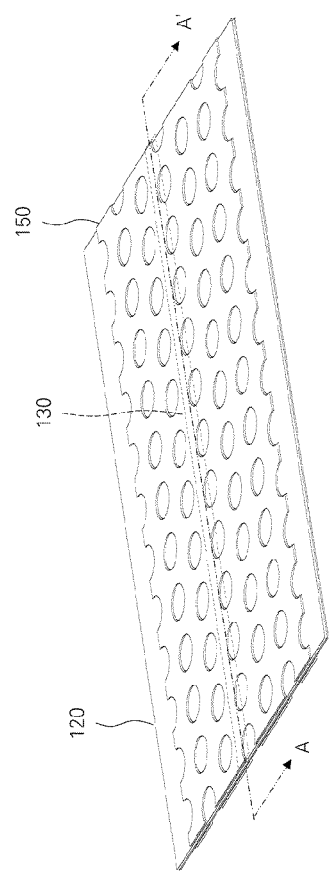

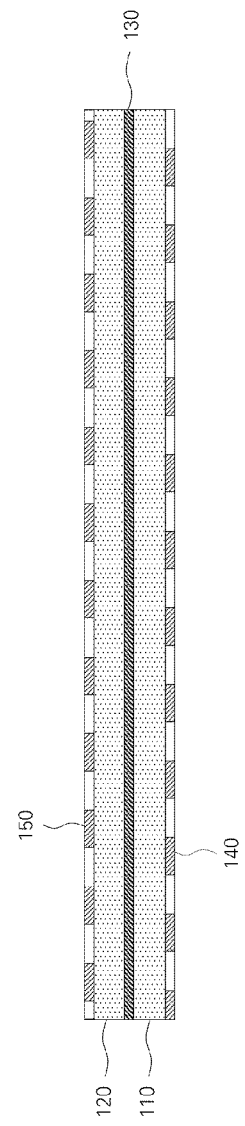
[Fig. 3]

[FIG. 4]
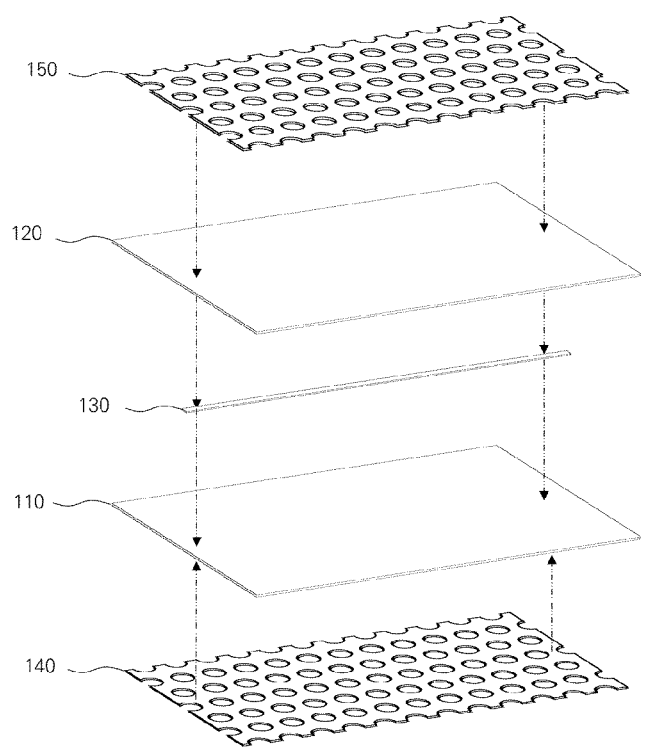

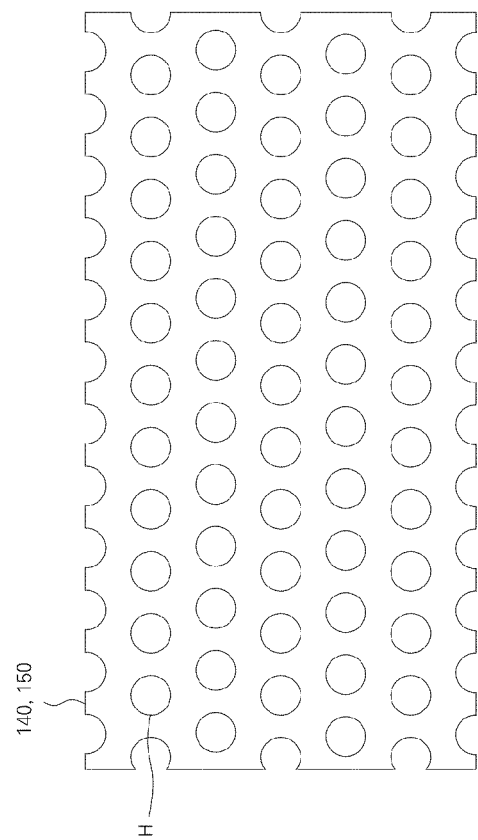
[Fig. 5]

[FIG. 6]
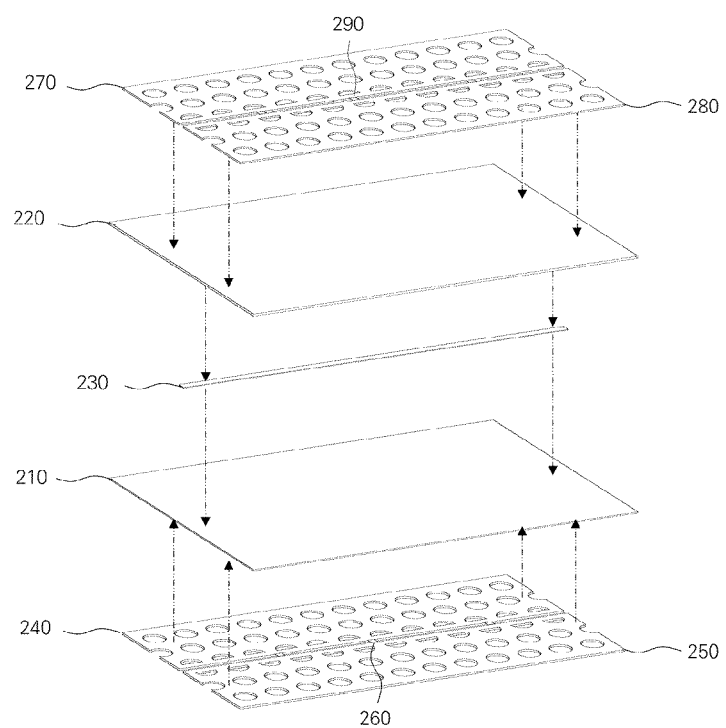

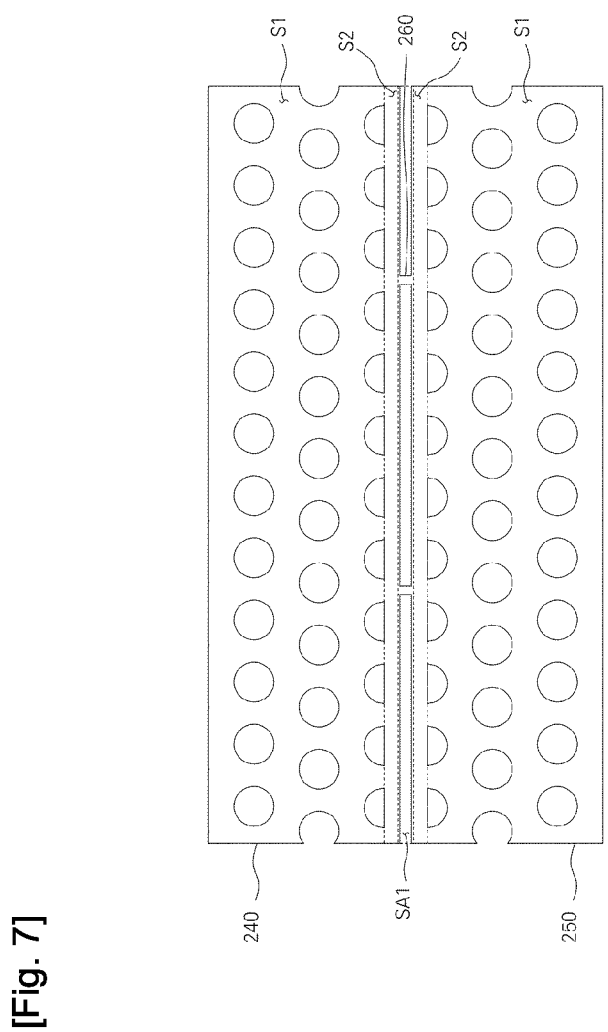
[Fig. 7]

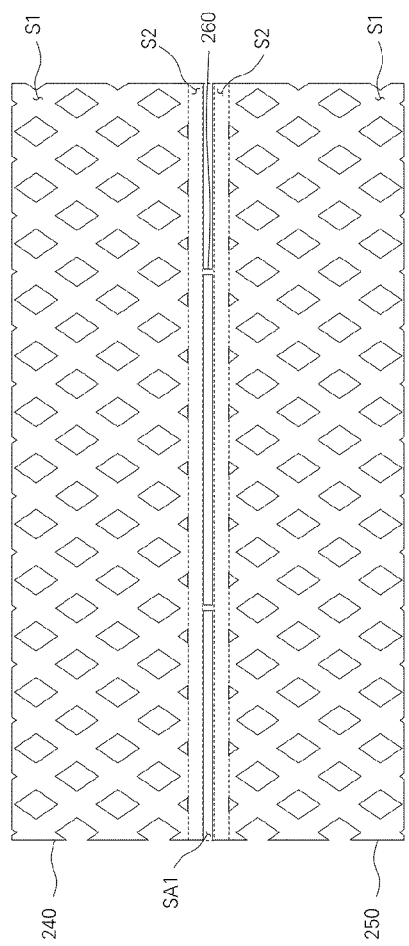
[Fig. 8]

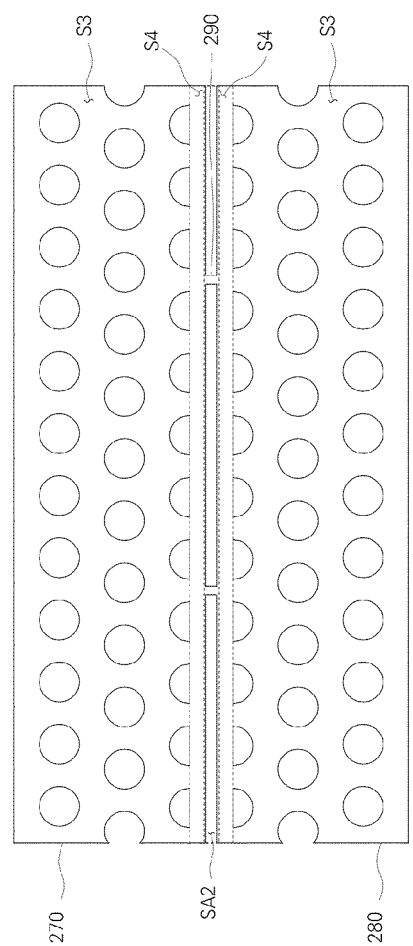
[Fig. 9]

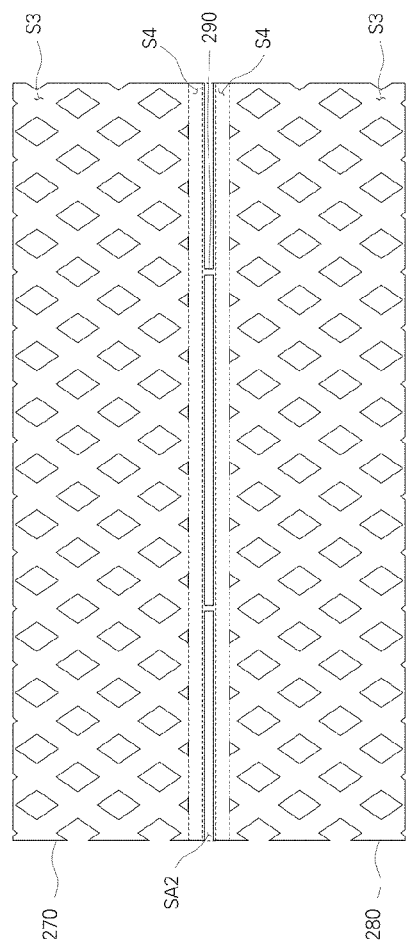
[Fig. 10]

FLEXIBLE PCB RF CABLE

TECHNICAL FIELD

The present invention relates to a flexible PCB RF cable, and more particularly, to a flexible PCB RF cable capable of RF transmission and reception using a flexible transmission line.

BACKGROUND ART

A flexible PCB RF cable is a cable that transmits and receives RF signals within electronic devices. In general, the flexible PCB RF cable is called a flexible PCB RF cable (FRC), and transmits and receives RF signals using a flexible transmission line.

Insertion loss and bending performance are important characteristics because flexible PCB RF cables are arranged at locations where rotation, bending, etc., occur in electronic devices. The bending performance of the flexible PCB RF cable means a degree of change in insertion loss according to the bending.

However, the conventional flexible PCB RF cable has a problem in that cracks occur in the cable pattern during a bending test, and the insertion loss increases due to the cracks in the cable pattern.

DISCLOSURE

Technical Problem

An object of the present invention is to provide a flexible PCB RF cable in which a ground pattern is formed of a conductor in a mesh structure having a plurality of circular holes, and thus cracks are minimized during bending.

Another object of the present invention is to provide a flexible PCB RF cable having a ground pattern that is divided into two ground patterns, which are connected through a connection pattern arranged in an area overlapped with a signal line pattern, and thus cracks are minimized during bending.

Technical Solution

According to a characteristic of the present disclosure for achieving the object, the present disclosure include a flexible PCB RF cable including: a first dielectric sheet; a second dielectric sheet that is arranged above the first dielectric sheet; a signal line pattern that is interposed between the first dielectric sheet and the second dielectric sheet; a first lower ground pattern that is a mesh pattern arranged below the first dielectric sheet; a second lower ground pattern that is arranged below the first dielectric sheet and is a mesh pattern spaced apart from the first lower ground pattern; a lower connection pattern that is arranged below the first dielectric sheet and connected to the first lower ground pattern and the second lower ground pattern; a first upper ground pattern that is a mesh pattern arranged above the second dielectric sheet; a second upper ground pattern that is arranged above the second dielectric sheet and is a mesh pattern spaced apart from the first upper ground pattern; and an upper connection pattern that is arranged above the second dielectric sheet and connected to the first upper ground pattern and the second upper ground pattern.

The first lower ground pattern and the second lower ground pattern may be mesh patterns in which a plurality of holes having one of a circular shape and a rhombic shape are formed. The first lower ground pattern and the second lower ground pattern may be divided into a first area in which the plurality of holes are formed and a second area in which no holes are formed. The signal line pattern may be overlapped with a first separation area formed between the first lower ground pattern and the second lower ground pattern, and the second area may be arranged between the first area and the first separation area. The lower connection pattern may be arranged in the first separation area and overlapped with the signal line pattern with the first dielectric sheet interposed therebetween.

The first upper ground pattern and the second upper ground pattern may be mesh patterns in which a plurality of holes having one of a circular shape and a rhombic shape are formed. The first upper ground pattern and the second upper ground pattern may be divided into a third area in which the plurality of holes are formed and a fourth area in which no holes are formed.

The signal line pattern may be overlapped with a second separation area formed between the first upper ground pattern and the second upper ground pattern, and the fourth area may be arranged between the third area and the second separation area. The upper connection pattern may be arranged in the second separation area and overlapped with the signal line pattern with the second dielectric sheet interposed therebetween.

According to a characteristic of the present disclosure for achieving the object, the present disclosure includes a flexible PCB RF cable including: a first dielectric sheet; a second dielectric sheet that is arranged above the first dielectric sheet; a signal line pattern that is interposed between the first dielectric sheet and the second dielectric sheet; a lower ground pattern that is arranged below the first dielectric sheet and is a mesh pattern in which a plurality of circular holes are formed; and a lower ground pattern that is arranged above the second dielectric sheet and is the mesh pattern in which the plurality of circular holes are formed. The signal line pattern may be overlapped with a portion of the lower ground pattern with the first dielectric sheet interposed therebetween, and overlapped with a portion of the lower ground pattern with the second dielectric sheet interposed therebetween.

Advantageous Effects

According to the present invention, since the flexible PCB RF cable has a ground pattern formed of a conductor in a mesh structure having a plurality of circular holes, compared to the conventional RF cable having a ground pattern in which rhombic-shaped holes are formed, it is possible to minimize the occurrence of cracks by dispersing the force applied to the ground pattern during the bending experiment.

In addition, since the flexible PCB RF cable has a ground pattern formed of a conductor in a mesh structure having a plurality of circular holes to minimize the occurrence of cracks, compared to the conventional RF cables having a ground pattern in which rhombic-shaped holes are formed, it is possible to improve bending performance by minimizing the change in insertion loss due to the bending.

In addition, the flexible PCB RF cable divides each of the upper ground pattern and the lower ground pattern into two ground patterns and connects these ground patterns through a connection pattern arranged in an area overlapped with a signal line pattern, compared to the conventional RF cable having a ground pattern in which rhombic-shaped holes are formed, it is possible to minimize the occurrence of cracks by dispersing the force applied to the ground pattern during the bending experiment.

In addition, the flexible PCB RF cable divides each of the upper ground pattern and the lower ground pattern into two ground patterns and connects these ground patterns through a connection pattern arranged in an area overlapped with a signal line pattern to minimize the occurrence in cracks, compared to the conventional RF cable having a ground pattern in which rhombic-shaped holes are formed, it is possible to improve bending performance by minimizing the change in insertion loss due to the bending.

DESCRIPTION OF DRAWINGS

FIG. 1 is a view for describing a flexible PCB RF cable according to an embodiment of the present invention.

FIGS. 2 to 4 are diagrams for describing a flexible PCB RF cable according to a first embodiment of the present invention.

FIG. 5 is a diagram for describing a ground pattern of the flexible PCB RF cable according to the first embodiment of the present invention.

FIG. 6 is a diagram for describing a flexible PCB RF cable according to a second embodiment of the present invention.

FIGS. 7 and 8 are diagrams for describing first and second lower ground patterns and a lower connection pattern of FIG. 6.

FIGS. 9 and 10 are diagrams for describing first and second upper ground patterns and an upper connection pattern of FIG. 6.

MODE FOR INVENTION

Hereinafter, in order to describe in detail to the extent that those skilled in the art can easily practice the technical idea of the present invention, the most preferred embodiments of the present invention will be described with reference to the accompanying drawings. First, it is to be noted that in giving reference numerals to components of each of the accompanying drawings, the same components will be denoted by the same reference numerals even though they are illustrated in different drawings. Further, in describing exemplary embodiments of the present invention, well-known functions or constructions will not be described in detail since they may unnecessarily obscure the understanding of the present invention.

Referring to FIG. 1, a flexible PCB RF cable 100 according to an embodiment of the present invention is a cable for transmitting an RF signal applied to small electronic devices 10 (or mobile devices) such as wearable devices and smart watches.

The flexible PCB RF cable is connected to circuit boards 12a and 12b stacked inside the small electronic device, and transmits the RF signals between the circuit boards 12a and 12b. In this case, as an example, the flexible PCB RF cable transmits and receives the RF signal of a Sub6 band (approximately 3.5 GHz) of a 5G communication band.

Referring to FIGS. 2 to 4, the flexible PCB RF cable 100 according to the first embodiment of the present invention is configured to include a first dielectric sheet 110, a second dielectric sheet 120, a signal line pattern 130, a lower ground pattern 140, and an upper ground pattern 150.

The first dielectric sheet 110 and the second dielectric sheet 120 are plate-shaped sheets having an upper surface, a lower surface, a first side, a second side, a third side, and a fourth side, and are made of a dielectric material. Here, the second side is a side opposite to the first side, the third side is a side connected to one end of the first side and one end of the second side, the fourth side is a side that is connected to the other end of the first side and the other end of the second side, and the fourth side is a side opposite to the third side.

The first dielectric sheet 110 and the second dielectric sheet 120 may be, for example, a dielectric sheet of one of a polyimide (PI) sheet, a modified PI (MPI) sheet, a liquid crystal polymer (LCP) sheet, and a poly tetra fluoro ethylene (PTFE) sheet.

The second dielectric sheet 120 is arranged above the first dielectric sheet 110. That is, the second dielectric sheet 120 is stacked on the upper surface of the first dielectric sheet 110, and the lower surface of the second dielectric sheet 120 is arranged to face the upper surface of the first dielectric sheet 110. In this case, the first dielectric sheet 110 and the second dielectric sheet 120 may be formed of dielectric sheets made of different materials.

The signal line pattern 130 is arranged between the first dielectric sheet 110 and the second dielectric sheet 120. The signal line pattern 130 is arranged on the upper surface of the first dielectric sheet 110 and the lower surface of the second dielectric sheet 120. The signal line pattern 130 is formed in a rectangular shape having a predetermined area.

The first side of the signal line pattern 130 is arranged on the same line as the first sides of the first dielectric sheet 110 and the second dielectric sheet 120, and the second side of the signal line pattern 130 opposite to the first side is arranged on the same line as the second sides of the first dielectric sheet 110 and the second dielectric sheet 120. Accordingly, the signal line patterns 130 are arranged in parallel with the third and fourth sides of the first dielectric sheet 110 and the second dielectric sheet 120.

Here, the flexible PCB RF cable 100 may further include a pair of terminal patterns (not illustrated) connected to both ends of the signal line pattern 130. However, since the terminal pattern has the same configuration as the prior art, detailed description and illustration thereof will be omitted.

The lower ground pattern 140 is arranged on the lower surface of the first dielectric sheet 110. For example, the lower ground pattern 140 is a mesh pattern in which a plurality of holes are formed.

The upper ground pattern 150 is arranged on the upper surface of the second dielectric sheet 120. For example, the upper ground pattern 150 is a mesh pattern in which a plurality of holes are formed.

Referring to FIG. 5, the upper ground pattern 150 and the lower ground pattern 140 are formed of a plate-shaped conductor. The upper ground pattern 150 and the lower ground pattern 140 are formed of a plate-shaped conductor in which a plurality of circular holes are formed. In this case, the plurality of circular holes are arranged spaced apart from each other.

As described above, since the flexible PCB RF cable 100 according to the present invention has a ground pattern formed of a conductor in a mesh structure having a plurality of circular holes, compared to the conventional RF cable having a ground pattern in which rhombic-shaped holes are formed, it is possible to minimize the occurrence of cracks by dispersing the force applied to the ground pattern during the bending experiment.

In addition, since the flexible PCB RF cable 100 according to the embodiment of the present invention has a ground pattern formed of a conductor in a mesh structure having a plurality of circular holes to minimize the occurrence of cracks, compared to the conventional RF cables having a ground pattern in which rhombic-shaped holes are formed, it is possible to improve bending performance by minimizing the change in insertion loss due to the bending.

Referring to FIG. 6, a flexible PCB RF cable 200 according to a second embodiment of the present invention is configured to include a first dielectric sheet 210, a second dielectric sheet 220, a signal line pattern 230, a first lower ground pattern 240, a second lower ground pattern 250, a lower connection pattern 260, a first upper ground pattern 270, a second upper ground pattern 280, and an upper connection pattern 290.

The first dielectric sheet 210 and the second dielectric sheet 220 are plate-shaped sheets having an upper surface, a lower surface, a first side, a second side, a third side, and a fourth side, and are made of a dielectric material. Here, the second side is a side opposite to the first side, the third side is a side connected to one end of the first side and one end of the second side, the fourth side is a side that is connected to the other end of the first side and the other end of the second side, and the fourth side is a side opposite to the third side.

The first dielectric sheet 210 and the second dielectric sheet 220 may be, for example, a dielectric sheet of one of a polyimide (PI) sheet, a modified PI (MPI) sheet, a liquid crystal polymer (LCP) sheet, and a poly tetra fluoro ethylene (PTFE) sheet.

The second dielectric sheet 220 is arranged above the first dielectric sheet 210. That is, the second dielectric sheet 220 is stacked on the upper surface of the first dielectric sheet 210, and the lower surface of the second dielectric sheet 220 is arranged to face the upper surface of the first dielectric sheet 210. In this case, the first dielectric sheet 210 and the second dielectric sheet 220 may be formed of dielectric sheets made of different materials.

The signal line pattern 230 is arranged between the first dielectric sheet 210 and the second dielectric sheet 220. The signal line pattern 230 is arranged on the upper surface of the first dielectric sheet 210 and the lower surface of the second dielectric sheet 220. The signal line pattern 230 is formed in a rectangular shape having a predetermined area.

The first side of the signal line pattern 230 is arranged on the same line as the first sides of the first dielectric sheet 210 and the second dielectric sheet 220, and the second side of the signal line pattern 230 opposite to the first side is arranged on the same line as the second sides of the first dielectric sheet 210 and the second dielectric sheet 220. Accordingly, the signal line patterns 230 are arranged in parallel with the third and fourth sides of the first dielectric sheet 210 and the second dielectric sheet 220.

The first lower ground pattern 240 is arranged on the lower surface of the first dielectric sheet 210. For example, the first lower ground pattern 240 is a mesh pattern in which a plurality of holes are formed.

The second lower ground pattern 250 is arranged on the lower surface of the first dielectric sheet 210. For example, the second lower ground pattern 250 is a mesh pattern in which a plurality of holes are formed.

Referring to FIG. 7, the first lower ground pattern 240 and the second lower ground pattern 250 are arranged on the lower surface of the first dielectric sheet 210 and are arranged spaced apart from each other by a predetermined distance.

The first lower ground pattern 240 is arranged adjacent to the third side of the first dielectric sheet 210 on the lower surface of the first dielectric sheet 210, and the second lower ground pattern 250 is arranged adjacent to the fourth side of the first dielectric sheet 210 on the lower surface of the first dielectric sheet 210. Accordingly, the first lower ground pattern 240 and the second lower ground pattern 250 are arranged spaced apart from each other on the lower surface of the first dielectric sheet 210.

A first separation area SA1 is formed between the first lower ground pattern 240 and the second lower ground pattern 250, and the first separation area SA1 is overlapped with the signal line pattern 230. Accordingly, the first lower ground pattern 240 and the second lower ground pattern 250 are arranged to face each other with the first separation area SA1 interposed therebetween. The first lower ground pattern 240 and the second lower ground pattern 250 face each other with the first separation area SA1 interposed therebetween, and have a symmetrical shape with respect to the first separation area SA1.

The first lower ground pattern and the second lower ground pattern may be mesh patterns in which a plurality of holes having one of a circular shape and a rhombic shape are formed. The first lower ground pattern and the second lower ground pattern may be divided into a first area S1 in which the plurality of holes are formed and a second area S2 in which no holes are formed. The signal line pattern may be overlapped with a first separation area formed between the first lower ground pattern and the second lower ground pattern, and the second area S2 may be arranged between the first area S1 and the first separation area. The lower connection pattern may be arranged in the first separation area and overlapped with the signal line pattern with the first dielectric sheet interposed therebetween.

The lower connection pattern 260 is formed in plurality and is arranged in the first separation area SA1 between the first lower ground pattern 240 and the second lower ground pattern 250. The lower connection pattern 260 connects the first lower ground pattern 240 and the second lower ground pattern 250. That is, a first end portion of the lower connection pattern 260 is connected to the first lower ground pattern 240, and a second end portion of the lower connection pattern 260 is connected to the second lower ground pattern 250. Through this, the first lower ground pattern 240 and the second lower ground pattern 250 constitute one lower ground pattern 140.

Meanwhile, referring to FIG. 8, the first lower ground pattern 240 and the second lower ground pattern 250 may be configured as a mesh pattern having rhombic-shaped holes. That is, the mesh pattern in which a plurality of rhombic-shaped holes are formed in the second areas of the first lower ground pattern 240 and the second lower ground pattern 250 may be configured.

The first upper ground pattern 270 is arranged on the upper surface of the second dielectric sheet 220. For example, the first upper ground pattern 270 is a mesh pattern in which a plurality of holes are formed.

The second upper ground pattern 280 is arranged on the upper surface of the second dielectric sheet 220. For example, the second upper ground pattern 280 is a mesh pattern in which a plurality of holes are formed.

Referring to FIG. 9, the first upper ground pattern 270 and the second upper ground pattern 280 are arranged on the upper surface of the second dielectric sheet 220 and are arranged spaced apart from each other by a predetermined distance.

The first upper ground pattern 270 is arranged adjacent to the third side of the second dielectric sheet 220 on the upper surface of the second dielectric sheet 220, and the second upper ground pattern 280 is arranged adjacent to the fourth side of the second dielectric sheet 220 on the upper surface of the second dielectric sheet 220. Accordingly, the first upper ground pattern 270 and the second upper ground pattern 280 are arranged spaced apart from each other on the upper surface of the second dielectric sheet 220.

A second separation area SA2 is formed between the first upper ground pattern 270 and the second upper ground pattern 280, and the second separation area SA2 is overlapped with the signal line pattern 230. Accordingly, the first upper ground pattern 270 and the second upper ground pattern 280 are arranged to face each other with the second separation area SA2 interposed therebetween. The first upper ground pattern 270 and the second upper ground pattern 280 face each other with the second separation area SA2 interposed therebetween, and have a symmetrical shape with respect to the second separation area SA2.

The first upper ground pattern 270 and the second upper ground pattern 280 include a third area S3 in which a plurality of circular holes are formed and a fourth area S4 in which no circular holes are formed. The third area S3 is an area in which a plurality of circular holes are formed, and is formed with a mesh pattern. The fourth area S4 is an area in which circular holes are not formed, and is formed with a plate-like pattern. In this case, the fourth area S4 is formed over one side adjacent to the area overlapped with the signal line pattern 230 among the four sides of the first upper ground pattern 270 and the second upper ground pattern 280, and the fourth area S4 is arranged parallel to the signal line pattern 230 on a plane.

The upper connection pattern 290 is formed in plurality and is arranged in the second separation area SA2 between the first upper ground pattern 270 and the second upper ground pattern 280. The upper connection pattern 290 connects the first upper ground pattern 270 and the second upper ground pattern 280. That is, a first end portion of the upper connection pattern 290 is connected to the first upper ground pattern 270, and a second end portion of the upper connection pattern 290 is connected to the second upper ground pattern 280. Through this, the first upper ground pattern 270 and the second upper ground pattern 280 constitute one upper ground pattern 150.

Meanwhile, referring to FIG. 10, the first upper ground pattern 270 and the second upper ground pattern 280 may be configured as a mesh pattern having rhombic-shaped holes. That is, the mesh pattern in which a plurality of rhombic-shaped holes are formed in the fourth areas S4 of the first upper ground pattern 270 and the second upper ground pattern 280 may be configured.

As described above, the flexible PCB RF cable 200 according to the embodiment of the present invention divides each of the upper ground pattern and the lower ground pattern into two ground patterns and connects these ground patterns through a connection pattern arranged in an area overlapped with a signal line pattern, compared to the conventional RF cable having a ground pattern in which rhombic-shaped holes are formed, it is possible to minimize the occurrence of cracks by dispersing the force applied to the ground pattern during the bending experiment.

In addition, the flexible PCB RF cable 100 according to the embodiment of the present invention divides each of the upper ground pattern and the lower ground pattern into two ground patterns and connects these ground patterns through a connection pattern arranged in an area overlapped with a signal line pattern to minimize the occurrence in cracks, compared to the conventional RF cable having a ground pattern in which rhombic-shaped holes are formed, it is possible to improve bending performance by minimizing the change in insertion loss due to the bending.

Although the preferred embodiments according to the present invention have been described above, modifications can be made in various forms, and it is understood that those skilled in the art can make various modifications and variations without departing from the scope of the claims of the present invention.

The invention claimed is:

1. A flexible Printed Circuit Board RF cable, comprising:
   a first dielectric sheet;
   a second dielectric sheet that is arranged above the first dielectric sheet;
   a signal line pattern that is interposed between the first dielectric sheet and the second dielectric sheet;
   a first lower ground pattern that is a mesh pattern arranged below the first dielectric sheet;
   a second lower ground pattern that is arranged below the first dielectric sheet and is a mesh pattern spaced apart from the first lower ground pattern to form a first separation area between the first lower ground pattern and the second lower ground pattern;
   a plurality of lower connection pattern that are arranged below the first dielectric sheet and connected to the first lower ground pattern and the second lower ground pattern;
   a first upper ground pattern that is a mesh pattern arranged above the second dielectric sheet;
   a second upper ground pattern that is arranged above the second dielectric sheet and is a mesh pattern spaced apart from the first upper ground pattern to form a second separation area between the first upper ground pattern and the second upper ground pattern; and
   plurality of upper connection pattern that are arranged above the second dielectric sheet and connected to the first upper ground pattern and the second upper ground pattern,
   wherein the signal line pattern is overlapped with the first separation area and the second separation area,
   wherein the plurality of lower connection patterns are arranged in the first separation area,
   wherein the plurality of upper connection patterns are arranged in the second separation area.

2. The flexible Printed Circuit Board RF cable of claim 1, wherein the first lower ground pattern and the second lower ground pattern are mesh patterns in which a plurality of holes having one of a circular shape and a rhombic shape are formed.

3. The flexible Printed Circuit Board RF cable of claim 2, wherein the first lower ground pattern and the second lower ground pattern are divided into a first area (S1) in which the plurality of holes are formed and a second area (S2) in which no holes are formed.

4. The flexible Printed Circuit Board RF cable of claim 3, wherein the second area is arranged between the first area and the first separation area.

5. The flexible Printed Circuit Board RF cable of claim 4, wherein the plurality of lower connection patterns are overlapped with the signal line pattern with the first dielectric sheet interposed therebetween.

6. The flexible Printed Circuit Board RF cable of claim 1, wherein the first upper ground pattern and the second upper ground pattern are mesh patterns in which a plurality of holes having one of a circular shape and a rhombic shape are formed.

7. The flexible Printed Circuit Board RF cable of claim 6, wherein the first upper ground pattern and the second upper ground pattern are divided into a third area (S3) in which the plurality of holes are formed and a fourth area (S4) in which no holes are formed.

8. The flexible Printed Circuit Board RF cable of claim 7, wherein the fourth area is arranged between the third area and the second separation area.

9. The flexible Printed Circuit Board RF cable of claim 8, wherein the plurality of upper connection pattern are overlapped with the signal line pattern with the second dielectric sheet interposed therebetween.

* * * * *